(12) United States Patent
Kimura et al.

(10) Patent No.: US 7,914,926 B2
(45) Date of Patent: Mar. 29, 2011

(54) FLAT-SHAPED BATTERY

(75) Inventors: Takashi Kimura, Osaka (JP); Kenichi Sano, Osaka (JP)

(73) Assignee: Hitachi Maxell, Ltd., Ibaraki-shi (JP)

( * ) Notice: Subject to any disclaimer, the term of this patent is extended or adjusted under 35 U.S.C. 154(b) by 120 days.

(21) Appl. No.: 11/376,310

(22) Filed: Mar. 16, 2006

(65) Prior Publication Data

US 2006/0208346 A1    Sep. 21, 2006

(30) Foreign Application Priority Data

Mar. 17, 2005 (JP) .................. 2005-077872

(51) Int. Cl.
*H01M 2/00* (2006.01)
*H01M 2/08* (2006.01)

(52) U.S. Cl. ............... 429/163; 429/175; 429/185

(58) Field of Classification Search ............ 429/163
See application file for complete search history.

(56) References Cited

U.S. PATENT DOCUMENTS

| | | | |
|---|---|---|---|
| 3,905,835 A | 9/1975 | Kasai | |
| 4,333,995 A * | 6/1982 | Ishida et al. | 429/172 |
| 6,127,064 A * | 10/2000 | Shibata et al. | 429/163 |
| 6,713,215 B2 * | 3/2004 | Watanabe et al. | 429/231.5 |
| 2001/0001369 A1 | 5/2001 | Adey et al. | |
| 2001/0006748 A1 * | 7/2001 | Ohmura et al. | 429/176 |
| 2002/0012838 A1 * | 1/2002 | Tsukada et al. | 429/176 |

FOREIGN PATENT DOCUMENTS

| | | |
|---|---|---|
| EP | 0993056 A1 | 4/2000 |
| EP | 1513216 A1 | 3/2005 |
| JP | 48-39932 | 6/1973 |
| JP | 50-12533 | 2/1975 |
| JP | 50-49637 | 5/1975 |
| JP | 53-26932 | 3/1978 |
| JP | 53-92620 | 7/1978 |
| JP | 53-92621 | 7/1978 |
| JP | 59-79971 U | 5/1984 |
| JP | 59-166359 U | 11/1984 |
| JP | 61-121257 A | 6/1986 |

(Continued)

OTHER PUBLICATIONS

IPDL JPO Machine Translation for Yoshiharu et al. JP 2004-300489.*

(Continued)

*Primary Examiner* — Dah-Wei D Yuan
*Assistant Examiner* — Adam A Arciero
(74) *Attorney, Agent, or Firm* — Birch, Stewart, Kolasch & Birch, LLP

(57) ABSTRACT

A flat-shaped battery according to the present invention includes: an outer can having an opening at its upper end; a gasket disposed at an inner edge of the opening; and a sealing plate that seals the opening together with the gasket. In this flat-shaped battery, the outer can houses a power generation element, the sealing plate is fixed to the inner edge of the opening of the outer can via the gasket by caulking, a nickel or nickel-containing plating layer having a thickness in a range from 1 to 10 μm is formed on an outer surface of a base composing the outer can, and a gold or gold-containing plating layer is formed on an outer surface of the nickel or nickel-containing plating layer.

4 Claims, 2 Drawing Sheets

FOREIGN PATENT DOCUMENTS

| | | | | |
|---|---|---|---|---|
| JP | 61-135047 | A | | 6/1986 |
| JP | 61121257 | A | * | 6/1986 |
| JP | 11-111243 | A | * | 4/1999 |
| JP | 11111243 | A | * | 4/1999 |
| JP | 2000164259 | A | * | 6/2000 |
| JP | 2001-181890 | A | | 7/2001 |
| JP | 2004-300489 | A | | 10/2004 |
| JP | 2004300489 | | * | 10/2004 |
| WO | WO-2005/022670 | A1 | | 3/2005 |

OTHER PUBLICATIONS

IPDL JPO Machine Translation for Takahashi et al. JP 11-111243A.*
Office Action issued Nov. 23, 2007, in Chinese Patent Application No. 2006100574196.

* cited by examiner

FLAT-SHAPED BATTERY

BACKGROUND OF THE INVENTION

1. Field of the Invention

The present invention relates to a flat-shaped battery that is formed in a flat shape such as a coin shape or a button shape as a whole and is to be used in electronic equipment such as a wristwatch.

2. Description of Related Art

JP 50(1975)-12533 A and JP 59(1984)-166359 U disclose a flat-shaped battery configured so that a positive electrode can for housing a power generation element is used as an outer can and a sealing plate that seals an opening provided at the upper end of the positive electrode can by being fixed to the inner edge of the opening together with a gasket by caulking is used as a negative electrode can. In JP 50(1975)-12533 A and JP 59(1984)-166359 U, a gold plating layer is formed on the outer surface of a stainless steel as a base composing the negative electrode can.

When the outer surface of a stainless steel base is covered with the gold plating layer as disclosed in JP 50 (1975)-12533 A and JP 59 (1984)-166359 U, the contact resistance between the base and a connection terminal of electronic equipment or the like decreases as compared with the case where the stainless steel is in direct contact with the connection terminal. Thus, it is possible to obtain stable discharging characteristics. Furthermore, gold is less prone to be oxidized, so that an increase in contact resistance on the outer surface of the battery can hardly occur even when the battery is used for a long time. Thus, it is possible to obtain excellent discharging characteristics over a long time.

In general, a steel plate of iron or an iron alloy such as stainless steel composing the base of the outer can is a rolled steel plate formed by rolling, and a bright annealed finish (a specular gloss finish) is given to a surface of such a rolled steel plate so as to gloss and smooth out the surface. However, even after the above-described surface treatment, the surface of the base of the outer can still has recesses and projections of about a few micrometers in dimension formed during the processing of the base. These recesses and projections are about 5 µm in dimension when the rolled steel plate is a stainless steel plate and are about 8 µm in dimension when the rolled steel plate is an iron steel plate. Thus, when the thickness of the gold plating layer is small, it is difficult to form the plating layer uniformly on the outer surface of the outer can because the recesses and projections on the base exist on the surface of the outer can. Thus, portions without the gold plating layer (so-called pinholes) are formed easily. In the case where the pinholes are formed as described above, a decrease in the contact resistance cannot be obtained when the contact portion between the outer can and electronic equipment is a portion where the pinhole is present. In particular, when the base is a material that is corroded easily (such as iron), the pinholes expedite the corrosion of the outer can.

One remedy against this problem is to make the gold plating layer thick enough to cover the recesses and projections on the base so as to prevent the pinholes from being formed in the gold plating layer. However, since the thickness of the gold plating layer needs to be greater than a vertical interval (an interval between the crest and the trough) of the recesses and projections, the cost of the battery increases considerably. Moreover, gold is soft and achieves only low adhesion to a stainless steel plate. Thus, when the gold plating layer is formed so as to have a thickness that can cover the vertical interval of the recesses and projections as described above, the plating layer formed nonuniformly is liable to be damaged so that, at the time of a caulking process or the like during the production of the battery, the gold plating layer may adhere to the inner surface of a die to be detached easily. This brings about another problem that the thus-formed gold plating layer may be detached from the outer can.

SUMMARY OF THE INVENTION

A flat-shaped battery according to the present invention includes: an outer can having an opening at its upper end; a gasket disposed at an inner edge of the opening; and a sealing plate that seals the opening together with the gasket. In this flat-shaped battery, the outer can houses a power generation element, the sealing plate is fixed to the inner edge of the opening of the outer can via the gasket by caulking, a nickel or nickel-containing plating layer having a thickness in a range from 1 to 10 µm is formed on an outer surface of a base composing the outer can, and a gold or gold-containing plating layer is formed on an outer surface of the nickel or nickel-containing plating layer.

According to the present invention, it is possible to provide a flat-shaped battery that allows a decrease in contact resistance to be achieved reliably even if a thin gold plating layer is formed on an outer surface of an outer can, and also prevents the gold plating layer from being detached easily from the outer surface of the outer can.

DETAILED DESCRIPTION OF THE INVENTION

Figure 1A:
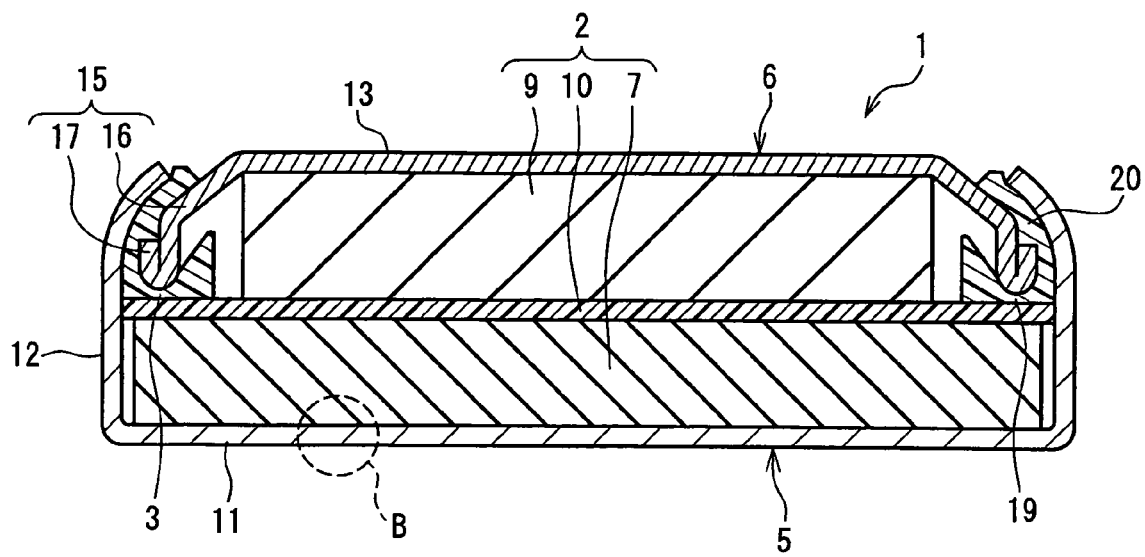
FIG. 1A is a sectional view of a flat-shaped battery according to the present invention.
Figure 1B:
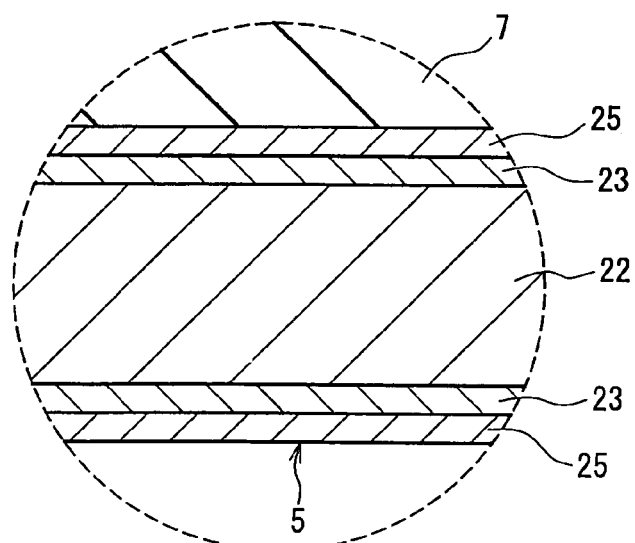
FIG. 1B is a partially enlarged view of FIG. 1A.
Figure 2:
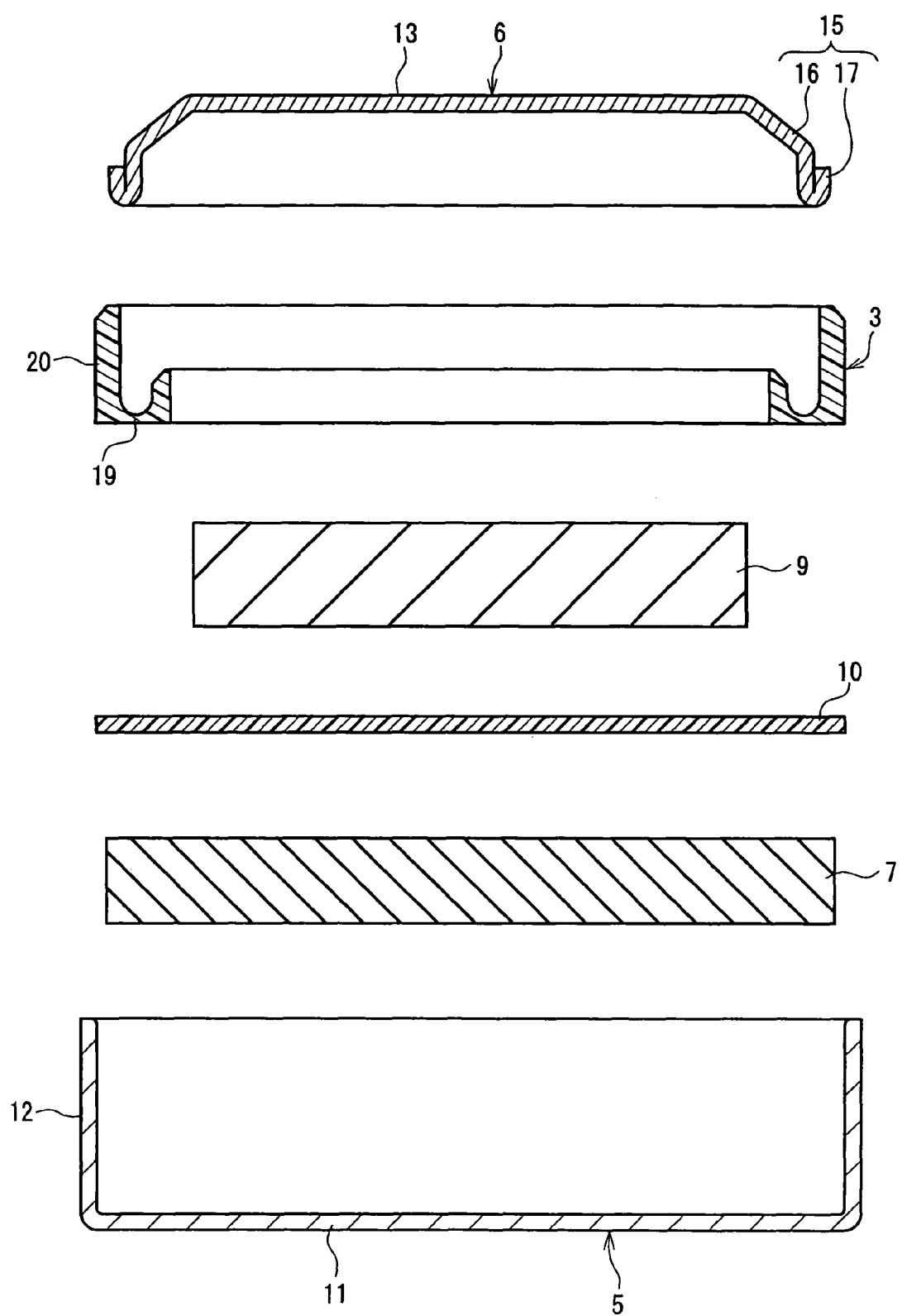
FIG. 2 is an exploded sectional view of the flat-shaped battery according to the present invention.

As shown in FIG. 1A, FIG. 1B and FIG. 2, a flat-shaped battery according to the present invention includes an outer can 5 having an opening at its upper end, a gasket 3 disposed at the inner edge of the opening, and a sealing plate 6 that seals the opening together with the gasket 3. The outer can 5 houses a power generation element 2 that includes a positive electrode material 7, a negative electrode material 9, and a separator 10. The sealing plate 6 is fixed to the inner edge of the opening of the outer can 5 via the gasket 3 by caulking. A nickel plating layer 23 having a thickness in the range from 1 to 10 µm is formed on the outer surface of a base composing the outer can 5, and a gold plating layer 25 is formed on the outer surface of the nickel plating layer 23. FIG. 1B is an enlarged view of a portion B in FIG. 1A.

In this flat-shaped battery, the outer can 5 may serve as a positive electrode or as a negative electrode. When the outer can 5 serves as a positive electrode, the sealing plate 6 serves as a negative electrode. When the outer can 5 serves as a negative electrode, the sealing plate 6 serves as a positive electrode. The nickel plating layer 23 may be formed of nickel alone or be a nickel-containing layer such as a nickel alloy of nickel and chromium or the like, and either of these configurations is encompassed in the present invention. The gold plating layer 25 may be formed of gold alone or be a gold-containing layer such as a gold alloy of gold and nickel or the like, and either of the configurations is encompassed in the present invention. The nickel plating layer 23 may be formed not only on the outer surface of the base 22 of the outer can 5 but also on the inner surface of the base 22 of the outer can 5 as shown in FIG. 1B. The nickel plating layer 23 and the gold plating layer 25 can be formed by electroplating, hot-dip plating, or vacuum plating, or also by coating, for example.

The thickness of the nickel plating layer 23 is in the range from 1 to 10 µm. When the thickness of the nickel plating layer 23 is smaller than 1 µm, it is not possible to smooth out the surface of the base 22 by covering the recesses and projections thereon with the nickel plating reliably. Thus, the recesses and projections appear on the surface of the outer can 5 through the gold plating layer 25. On the other hand, even if the thickness of the nickel plating layer 23 is increased to exceed 10 µm, further improvement in the smoothness of the surface of the outer can 5 hardly is achieved, resulting in a mere increase in the thickness of the outer can 5.

The thickness of the gold plating layer 25 preferably is in the range from 0.05 to 0.5 µm. When the thickness of the gold plating layer 25 is smaller than 0.05 µm, the formation of pinholes increases significantly, thereby increasing exposed portions of the nickel plating layer 23 formed under the gold plating layer 25. Thus, the effect of decreasing the contact resistance may not be produced effectively. Furthermore, during the use of the battery, the gold plating layer 25 wears out easily owing to the contact with a connection terminal of electronic equipment, and besides, it becomes difficult to obtain the result of decreasing the contact resistance produced by the gold plating. On the other hand, even if the thickness of the gold plating layer 25 is greater than 0.5 µm, the contact resistance does not decrease substantially as compared with the case where the thickness of the gold plating layer 25 is not greater than 0.5 µm. Thus, forming the gold plating layer 25 so as to have a thickness greater than 0.5 µm is disadvantageous in terms of cost because extra cost is required for forming the gold plating layer.

The base 22 may be formed of iron or an iron alloy such as a stainless steel.

In the flat-shaped battery according to the present invention, the nickel plating layer 23 is present between the base 22 of the outer can 5 and the gold plating layer 25. Thus, the nickel plating layer 23 covers the recesses and projections on the surface of the base 22, thus smoothing out the surface of the outer can 5. Accordingly, even if the gold plating layer 25 is thin, the formation of pinholes can be prevented. Besides, since the thickness of the gold plating layer 25 can be reduced, the cost required for producing the battery can be reduced accordingly. Moreover, by providing the nickel plating layer 23 under the gold plating layer 25, it becomes possible to prevent the corrosion of the base 22 from being caused by any pinholes formed in the gold plating layer 25. Furthermore, the fact that the gold plating layer 25 is the outermost layer of the base 22 brings about further advantageous effects in that the value of the battery in terms of design can be improved by its glossy surface and that the contact resistance between the outer can 5 and a connection terminal of electronic equipment or the like can be decreased over a long time so that stable discharging characteristics can be reliably obtained. This is particularly advantageous in the case where the contact between the outer can 5 and the connection terminal is point contact. Furthermore, as compared with the case where the gold plating layer 25 is formed directly on the base 22, the adhesion of the gold plating layer 25 to the outer can 5 is improved by the nickel plating layer 23 intervening therebetween. Thus, the gold plating layer 25 can be prevented from being detached, for example, when the outer can 5 is subjected to press processing.

Hereinafter, one example of a flat-shaped battery according to the present invention configured so that an outer can 5 serves as a positive electrode and a sealing plate 6 serves as a negative electrode will be described with reference to the drawings. As shown in FIG. 1A, the flat-shaped battery 1 has a flat figure as a whole and includes an outer can (a positive electrode can) 5 for housing a power generation element 2 and a sealing plate (a negative electrode can) 6 that seals an opening provided at the upper end of the positive electrode can 5 by being fixed to the inner edge of the opening together with a gasket 3 by caulking. The power generation element 2 includes a disk-shaped positive electrode material 7, a disk-shaped negative electrode material 9, and a separator 10 provided between the positive electrode material 7 and the negative electrode material 9. The flat-shaped battery 1 is filled with an electrolyte solution. An electrolyte solution absorber (not shown) is laminated on the upper side of the separator 10.

The positive electrode material 7 is obtained by forming powders of a mixture containing silver oxide ($Ag_2O$) as a positive active material, flake graphite as a conductive aid, etc. into a desired shape by pressing. The negative electrode material 9 is formed of zinc as a negative active material. The separator 10 is obtained by laminating a graft film on a cellophane film. As the graft film, it is possible to use a film obtained by graft-polymerizing methacrylic acid with cross-linked low-density polyethylene. The electrolyte solution is prepared by dissolving zinc oxide in a potassium hydroxide aqueous solution. The electrolyte solution absorber is formed of a mixture paper composed of vinylon and rayon.

As shown in FIG. 2, before the assembly of the battery, the positive electrode can 5 has a shape like a deep round dish including a round bottom wall 11 and a peripheral side wall 12 that extends upward from the outer periphery of the bottom wall 11. The negative electrode can 6 has a shape like a shallow round dish including a round top wall 13 and a peripheral side wall 15 that extends downward from the outer periphery of the top wall 13. The peripheral side wall 15 of the negative electrode can 6 includes a diameter increasing portion 16 that extends obliquely downward from the outer periphery of the top wall 13 and a sealing portion 17 provided continuously at the lower end of the diameter increasing portion 16 and folded so as to extend upward.

The gasket 3 is made of a polyamide-based resin with excellent elasticity and insulation properties, such as Nylon 66, and is formed into a ring shape by injection molding. The gasket 3 is disposed on the upper side of the positive electrode material 7 via the separator 10. The gasket 3 includes a ring-shaped base portion 19 and an outer cylinder wall 20 that projects upward from an outer edge portion of the base portion 19 and is to be held between the peripheral side wall 12 of the positive electrode can 5 and the peripheral side wall 15 of the negative electrode can 6. The negative electrode can 6 is formed of a clad material with a three-layer structure composed of a copper layer, a steel layer, and a nickel layer, and the outer side of the copper layer is plated with tin. Note here that the copper layer-side of the negative electrode can 6 would be an inner side of the battery.

As shown in FIG. 1B, the positive electrode can 5 is configured so that nickel plating layers 23 are formed respectively on both surfaces of a base 22 that is formed of iron alone or an iron alloy such as stainless steel and gold plating layers 25 are formed on the outer side of the respective nickel plating layers 23. The thickness of the base 22 of the positive electrode can 5 preferably is in the range from 50 to 300 µm. When the thickness of the base 22 is smaller than 50 µm, the base 22 has insufficient strength required for a base such that it can be deformed easily. On the other hand, a thickness of the base 22 greater than 300 µm is not preferable because, although the base has sufficient strength, the battery capacity relative to the battery volume becomes small due to the increase in the thickness of the base. The nickel plating layers 23 of the positive electrode can 5 can be formed of nickel alone or be a nickel-containing layer such as a nickel alloy, such as an alloy of nickel and chromium or the like. The specific composition of the nickel plating layer is not critical. Each of the nickel plating layers 23 can be formed by performing electroplating, hot-dip plating, vacuum plating, or the like with respect to the base 22.

Conditions of the plating etc. are set so that the thickness of each of the nickel plating layers 23 would be in the range from 1 to 10 μm. The reason for this is as follows. The base 22 is formed of a rolled steel plate or the like and thus has recesses and projections of about 2 to 8 μm on its surface. When the thickness of the nickel plating layer 23 is smaller than 1 μm, it is difficult to cover the recesses and projections on the base 22 with the nickel plating reliably, so that the recesses and projections appear on the surface of the positive electrode can 5 through the gold plating layer 25. On the other hand, even if the thickness of the nickel plating layer 23 is increased to exceed 10 μm, further improvement in the smoothness of the surface of the positive electrode can 5 hardly is achieved, resulting in a mere increase in the thickness of the positive electrode can 5.

Each of the nickel plating layers 23 is formed so as to have a preferable thickness depending on the size of the recesses and projections on the base surface (i.e., the surface roughness of the base surface), and it is preferable that the size of the recesses and projections on the base surface after the nickel plating layer 23 has been formed is not more than 1.5 μm (i.e., the surface roughness Ra is not more than 1.5). Note here that the surface roughness Ra refers to a centerline average roughness specified by Japanese Industrial Standards (JIS) B 0601. By smoothing out the base surface and allowing the surface roughness Ra to be not more than 1.5 by the formation of the nickel plating layer 23, it becomes possible to form the gold plating layer 25 uniformly, thus allowing an effect of decreasing the contact resistance to be obtained.

Preferably, the nickel plating layer 23 is caused to have a layered crystal structure (in which atoms are arranged in the horizontal direction) by bright electroplating using an organic substance or the like. In the case where ordinary plating is performed, a plating layer formed has a columnar crystal structure (in which atoms are arranged in the vertical direction), so that the formation of the plating layer occurs on the projection portions while the same seldom occurs on the recess portions. Thus, it is difficult to smooth out the recesses and projections on the surface of the positive electrode can by providing the plating layer. However, by allowing the nickel plating layer 23 to have a layered crystal structure, it becomes possible to smooth out the recesses and projections on the surface of the positive electrode can.

In order to achieve the layered crystal structure by bright electroplating using an organic substance, a first brightening agent and a second brightening agent are used. Examples of the first brightening agent include organic substances such as sulfonamide, sulfonimide, and saccharin. Examples of the second brightening agent include organic substances such as acetylene and derivatives thereof and formaldehyde. When the above-described brightening agents are used, the concentrations of the brightening agents are low at the recess portions and high at the projection portions during the electroplating. As a result, the thickness of the plating layer becomes great at the recess portions and small at the projection portions, thus allowing the recesses and projections on the surface of outer can to be smoothed out.

When the base 22 is formed of an iron alloy such as stainless steel, the thickness of each of the nickel plating layers 23 preferably is in the range from 1 to 6 μm. When the base 22 is formed of iron alone, the thickness of each of the nickel plating layers 23 preferably is in the range from 4 to 10 μm. The thickness of the nickel plating layer 23 is determined as appropriate depending on the material of the base, but preferably is determined as appropriate with consideration given to the state of the recesses and projections on the base surface as well. In this case, since each of the nickel plating layers 23 has a thickness of at least 1 μm, even if pinholes are formed in the gold plating layer 25, it is possible to prevent the corrosion of the base 22 reliably, to improve the adhesion of the gold plating layer 25 to be formed later, and to prevent the detachment of the gold plating layer 25.

The gold plating layers 25 of the positive electrode can 5 are formed of gold alone or a gold-containing layer such as a gold alloy of gold and nickel or the like, and are formed on the outer side of the respective nickel plating layers 23 by electroplating, hot-dip plating, vacuum plating, or the like. The thickness of each of the thus-formed gold plating layers 25 preferably is in the range from 0.05 to 0.5 μm. The thickness of the gold plating layer 25 is determined as appropriate depending on the state of the recesses and projections on the surface of the nickel plating layer etc.

When assembling the battery, the positive electrode material 7 and the separator 10 are placed inside the positive electrode can 5 and then the negative electrode material 9 is placed on the upper side of the separator 10. Thereafter, the electrolyte solution is poured into the positive electrode can 5. The gasket 3 is attached to the peripheral side wall 15 of the negative electrode can 6 from beneath the negative electrode can 6, and then the negative electrode can 6 is fitted into the positive electrode can 5 that is filled with the electrolyte solution. Subsequently, caulking is performed by bending the open upper end of the peripheral side wall 12 of the positive electrode can 5 inward. This causes the gasket 3 to be compressed between the peripheral side wall 12 of the positive electrode can 5 and the peripheral side wall 15 of the negative electrode can 6, whereby the positive electrode can 5 and the negative electrode can 6 are sealed closely. The outer peripheral surface-side of the peripheral side wall 12 of the positive electrode can 5 is also stretched by being curved inward. Thus, for example, if pinholes and the like are present in the nickel plating layer 23, cracks are likely to initiate at the pinholes. Such cracks may extend to the gold plating layer 25, thus exposing the base 22 to the outside air. This causes rust to generate and grow so as to increase the contact resistance. According to the present invention, when the gold plating is formed on the positive electrode can (the outer can) 5, such problems can be avoided by providing the nickel plating layer 23 having a suitable thickness under the gold plating layer 25.

By forming the gold plating layer 25 on the outer surface of the positive electrode can 5 as described above, it becomes possible to allow users (consumers) who cannot distinguish between the positive electrode and the negative electrode to easily identify the positive electrode and the negative electrode of the battery by providing them with an instruction manual. Besides, the appearance of the battery as a whole is improved to impart a high-class appearance to the design of the battery, thus enhancing the buying motivation of consumers. Moreover, when the contact between the outer can 5 and a connection terminal of electronic equipment or the like is point contact as described above, it is possible to maintain a favorable contact at all times.

Although the gold plating layers 25 are formed respectively on both the outer surface and the inner surface of the positive electrode can 5 in the present embodiment, the gold plating layer 25 may be formed only on the outer surface of the positive electrode can 5. Furthermore, the shape of the flat-shaped battery according to the present invention is not limited to a disk shape, but may be a flat rectangular or triangular shape, for example.

Components in common between FIG. 1A, FIG. 1B and FIG. 2 are given the same reference numerals, and duplicate description has been omitted.

Next, the present invention will be described more specifically by way of examples. It is to be noted, however, the present invention is by no means limited to the following examples.

Example 1

A flat-shaped battery having the configuration as shown in FIG. 1A was produced in the following manner.
<Material of base> A stainless steel plate (SUS 430, bright annealed finish) having a surface roughness Ra of 5.5 and a thickness of 150 μm was used as the base 22.
<Nickel plating layer> The surface roughness Ra of the outer surface of the nickel plating layer 23 was 1.3, and the thickness of the nickel plating layer 23 was 5 μm.
<Gold plating layer> The gold plating layer 25 had a thickness of 0.1 μm.

Except for the above, the configuration of the flat-shaped battery according to Example 1 is the same as that of the above-described flat-shaped battery shown in FIG. 1A, and description thereof thus has been omitted.

Example 2

A flat-shaped battery was produced in the same manner as in Example 1, except that the thickness of the gold plating layer 25 was 0.3 μm.

Example 3

A flat-shaped battery was produced in the same manner as in Example 1, except that the thickness of the gold plating layer 25 was 0.5 μm.

Example 4

A flat-shaped battery was produced in the same manner as in Example 1, except that the surface roughness Ra of the outer surface of the nickel plating layer 23 was 4.8, the thickness of the nickel plating layer 23 was 1 μm, and the thickness of the gold plating layer 25 was 0.3 μm.

Comparative Example 1

A flat-shaped battery was produced in the same manner as in Example 1, except that the gold plating layer 25 was not formed on the outer surface of the nickel plating layer 23.

Comparative Example 2

A flat-shaped battery was produced in the same manner as in Example 1, except that the nickel plating layer 23 was not formed and the thickness of the gold plating layer 25 was 0.3 μm.

Comparative Example 3

A flat-shaped battery was produced in the same manner as in Example 1, except that the nickel plating layer 23 was not formed and the thickness of the gold plating layer 25 was 5 μm.

Comparative Example 4

A flat-shaped battery was produced in the same manner as in Example 1, except that neither the nickel plating layer 23 nor the gold plating layer 25 was formed.

<Measurement of Thickness of Plating Layers>

The thickness of the central portion of the bottom wall 11 of the positive electrode can 5 was measured and the intensity measured using an energy dispersive X-ray fluorescence analysis device was converted into the thickness of each of the plating layers.

<Measurement of Contact Resistance>

With regard to each of the batteries according to Examples 1 to 4 and Comparative Examples 1 to 4, the contact resistance on the surface of the positive electrode can 5 was measured at 20° C. immediately after the production of the battery and after 30-day storage of the battery. The contact resistance was measured according to a four-terminal method using a gold wire under a load of 50 g. Table 1 shows the results of the contact resistance measurement.

TABLE 1

|  | Thickness of nickel plating layer (μm) | Thickness of gold plating layer (μm) | Contact resistance immediately after battery production (mΩ) | Contact resistance after 30-day battery storage (mΩ) |
| --- | --- | --- | --- | --- |
| Ex. 1 | 5 | 0.1 | 0.6 | 1.2 |
| Ex. 2 | 5 | 0.3 | 0.7 | 0.8 |
| Ex. 3 | 5 | 0.5 | 0.5 | 0.9 |
| Ex. 4 | 1 | 0.3 | 0.8 | 1.0 |
| Comp. Ex. 1 | 5 | — | 9.6 | 63 |
| Comp. Ex. 2 | — | 0.3 | 9800 | 160000 |
| Comp. Ex. 3 | — | 5 | 0.6 | 0.9 |
| Comp. Ex. 4 | — | — | 11100 | 200000 |

As shown in Table 1, the contact resistances of the batteries according to Examples 1 to 4 immediately after the battery production and after 30-day battery storage were lower than those of the batteries according to Comparative Examples 1, 2, and 4. Since the gold plating layer 25 was not formed in the battery according to Comparative Example 1, the contact resistances thereof were higher than those of the batteries according to Examples 1 to 4. Furthermore, since neither the nickel plating layer 23 nor the gold plating layer 25 was formed in the battery according to Comparative Example 4, the base 22 of the positive electrode can 5 was exposed directly, which caused the contact resistances to be considerably higher that those of the batteries according to Examples 1 to 4. In the battery according to Comparative Example 2, the nickel plating layer 23 was not formed, so that the surface of the positive electrode can 5 was not smoothed out by the nickel plating, and besides, the gold plating layer 25 was thin. Therefore, the formation of pinholes increased, resulting in exposed portions of the base 22 of the positive electrode can 5. As a result, portions exhibiting a high contact resistance were present from place to place, which is considered to have led to an increase in contact resistance. The battery according to Comparative Example 3 is not practical although it achieved a decrease in contact resistance. The reason for this is that the gold plating may adhere to the dies used for the production of the battery, which leads to a problem regarding the mass-productivity, and that the cost of the battery increases considerably.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A flat-shaped battery comprising:
an outer can having an opening at its upper end;
a gasket disposed at an inner edge of the opening; and
a sealing plate that seals the opening together with the gasket,
wherein the outer can houses a power generation element,
the sealing plate is fixed to the inner edge of the opening of the outer can via the gasket by caulking,
an organic bright nickel plating layer or an organic bright nickel-containing plating layer is formed on an outer surface and an inner surface of a base composing the outer can,
a gold plating layer or a gold-containing plating layer is formed on an outer surface of the organic bright nickel plating layer or the organic bright nickel-containing plating layer that is formed on the outer surface and the inner surface of the base,
the base is formed of iron, and
the organic bright nickel plating layer or the organic bright nickel-containing plating layer has a thickness in a range from 4 to 10 µm.

2. The flat-shaped battery according to claim 1, wherein the gold plating layer or the gold-containing plating layer has a thickness in a range from 0.05 to 0.5 µm.

3. The flat-shaped battery according to claim 1, wherein the organic bright nickel plating layer or the organic bright nickel-containing plating layer has a surface roughness Ra of not more than 1.5.

4. The flat-shaped battery according to claim 1, wherein the organic bright nickel plating layer or the organic bright nickel-containing plating layer has a layered crystal structure.

* * * * *